(12) United States Patent
Ohta et al.

(10) Patent No.: US 7,193,270 B2
(45) Date of Patent: Mar. 20, 2007

(54) SEMICONDUCTOR DEVICE WITH A VERTICAL TRANSISTOR

(75) Inventors: Hiroyuki Ohta, Tsuchiura (JP); Yukihiro Kumagai, Chiyoda (JP); Masahiro Moniwa, Itami (JP); Shingo Nasu, Chiyoda (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/849,211

(22) Filed: May 20, 2004

(65) Prior Publication Data

US 2004/0232480 A1 Nov. 25, 2004

(30) Foreign Application Priority Data

May 20, 2003 (JP) ............................. 2003-141403

(51) Int. Cl.
*H01L 29/76* (2006.01)
(52) U.S. Cl. .................. 257/329; 257/67; 257/330; 257/331; 257/E27.091
(58) Field of Classification Search ........ 257/329–331, 257/E27.091, 67
See application file for complete search history.

(56) References Cited

U.S. PATENT DOCUMENTS

| | | | | |
|---|---|---|---|---|
| 5,483,094 A | * | 1/1996 | Sharma et al. ............. | 257/316 |
| 5,504,359 A | * | 4/1996 | Rodder ...................... | 257/329 |
| 5,707,885 A | * | 1/1998 | Lim .......................... | 438/155 |
| 5,872,374 A | * | 2/1999 | Tang et al. ................. | 257/328 |
| 5,977,589 A | * | 11/1999 | Schloesser et al. ......... | 257/329 |
| 6,049,106 A | * | 4/2000 | Forbes ...................... | 257/329 |
| 6,060,746 A | * | 5/2000 | Bertin et al. ............... | 257/331 |
| 6,198,121 B1 | * | 3/2001 | Sung ......................... | 257/296 |
| 6,638,823 B2 | * | 10/2003 | Cho et al. .................. | 438/268 |
| 2003/0015755 A1 | * | 1/2003 | Hagemeyer ................ | 257/329 |

FOREIGN PATENT DOCUMENTS

| | | |
|---|---|---|
| JP | 05251710 A | 9/1993 |
| JP | 06-268173 | 9/1994 |
| JP | 10-107286 | 4/1998 |
| JP | 10-326879 | 12/1998 |
| JP | 2001-320031 | 11/2001 |

\* cited by examiner

*Primary Examiner*—Eugene Lee
(74) *Attorney, Agent, or Firm*—Antonelli, Terry, Stout and Kraus, LLP.

(57) ABSTRACT

A semiconductor device which, even when a vertical transistor is adopted, is able to prevent a product yield from decreasing and performance from deteriorating, and at the same time, to achieve high-density integration of chips and high performance. The semiconductor device includes: a semiconductor substrate; a tower-like gate pillar formed on the semiconductor substrate via an insulation layer and including a channel region formed so as to be positioned between impurity diffusion regions in a vertically extended direction with respect to a principal side of the substrate; a gate insulation film formed on an outer surface of the gate pillar; and a gate electrode film including multiple conductive layers formed on an outer surface of the gate insulation film.

3 Claims, 7 Drawing Sheets

SEMICONDUCTOR DEVICE WITH A VERTICAL TRANSISTOR

CLAIM OF PRIORITY

The present application claims priority from Japanese application JP2003-141403, filed on May 20, 2003, the content of which is hereby incorporated by reference into this application.

BACKGROUND OF THE INVENTION

1. Field of the Invention

The present invention relates to a semiconductor device and a manufacturing method therefor.

2. Description of the Related Art

The demands for reduction in chip area with respect to memory LSI, system LSI, and other semiconductor devices, are increasing each year, coupled with the miniaturization of information communications equipment in recent years. It is desired, therefore, that memory cell areas be reduced with the conventional electrical characteristics of transistors being maintained. Vertical transistors are employed as an approach to implementing such reduction in cell area. Conventional vertical transistors include: a type in which, as disclosed in Japanese Patent Laid-open No. 2001-320031, a hole is formed in the thin film formed on a silicon substrate and a vertical transistor has its channel embedded in the hole; a type in which, as disclosed in Japanese Patent Laid-open No. 10-107286, a hole is formed in a silicon substrate and a side of the hole is used as a channel; and a type in which, as disclosed in Japanese Patent Laid-open No. 10-326879, a protrusion of silicon is formed on a silicon substrate and used as a channel.

The conventional vertical transistors require preventive measures against the deterioration of their electrical characteristics, increases in the nonuniformity of the characteristics, and other events. In embodiments of the aforementioned conventional technologies, however, concrete preventive measures are not incorporated against decreases in product yield or against performance deterioration. The present inventors have studied the fact that the deterioration of electrical characteristics and increases in the nonuniformity thereof, caused by excessive stresses in comparison with those of conventional lateral transistors, result in product yield decreases and performance deterioration becoming problems. That is to say, the present inventors have studied the fact that the above is associated with several problems. More specifically, since the region for forming a channel is excessively stressed, drain current "ids" is affected by the stress. Also, since the stress on a gate oxide film also becomes excessive similarly, the leakage current in the gate oxide film increases. In addition, nonuniform processing of the silicon section including the channel region easily changes the internal stress thereof and the stress on the gate oxide film, thus increasing not only drain current "ids", but also the leakage current in the gate oxide film and the nonuniformity of withstand voltage characteristics.

SUMMARY OF THE INVENTION

In view of the foregoing, the present invention has been made, and an object of the present invention is to solve at least one of the above problems.

The stress of a gate electrode film in a vertical transistor is reduced by using a plural-layered film structure, ion implantation, or the like, and reducing the stresses applied to a gate oxide film or silicon tower of the vertical transistor, and more particularly, to a channel section thereof. Thus, the above problems are solved and this, in turn, makes it possible, even when a vertical transistor is adopted, to prevent a product yield from decreasing and performance from deteriorating, and hence to achieve high-density integration of chips and high performance.

More specifically, the present invention can take either of the following aspects:

A semiconductor device according to an aspect comprises: a semiconductor substrate; a tower-like gate pillar formed on the semiconductor substrate via an insulation layer and having a channel region formed so as to be positioned between impurity diffusion regions in a layering direction; a gate insulation film formed on an outer surface of the gate pillar; and a gate electrode film formed on an outer surface of the gate insulation film; wherein the gate electrode film is formed of plural layers each formed in order from the gate pillar, in the direction where the gate electrode film is formed.

A semiconductor device according to another aspect comprises: a semiconductor substrate; a tower-like gate pillar formed on the semiconductor substrate via an insulation layer and having a channel region formed so as to be positioned between impurity diffusion regions in a layering direction; a gate electrode film formed so as to enclose an outer circumferential side of the gate pillar; and a gate insulation film formed between the gate pillar and the gate electrode film; wherein the gate electrode film includes a first electrode film formed so as to enclose the gate pillar from a circumferential direction, and a second electrode film formed so as to enclose the first electrode film from an outer circumferential side.

Thus, either of the above aspects makes it possible to produce a fine crystalline grain structure effectively in a radial direction of the gate pillar and hence to effectively reduce the stresses applied. In addition, deterioration of electrical characteristics can be effectively suppressed by effectively reducing the stress applied to the film facing the gate insulation film.

On the basis of the aforementioned characteristics of the gate electrode film, the present inventors have investigated publicly known examples. As a result, it has been found that a plurality of electrodes are disclosed as an embodiment in, for example, Japanese Patent Laid-open No. 5-251710. In this embodiment, however, the electrodes constituting a flash memory are only disclosed and no single electrode is of multi-layered structure. In addition, although examples of a vertical transistor are disclosed in Japanese Patent Laid-open No. 6-268173, all of the examples relate to disclosure of single-layered electrodes.

DESCRIPTION OF THE PREFERRED EMBODIMENTS

Preferred embodiments of the present invention will be described below using FIGS. 1 to 7. The present invention is not limited to the embodiments exemplified in the present specification, and does not limit modifications based on well-known technologies or on any of the technologies that have come to be well known.

Figure 1:
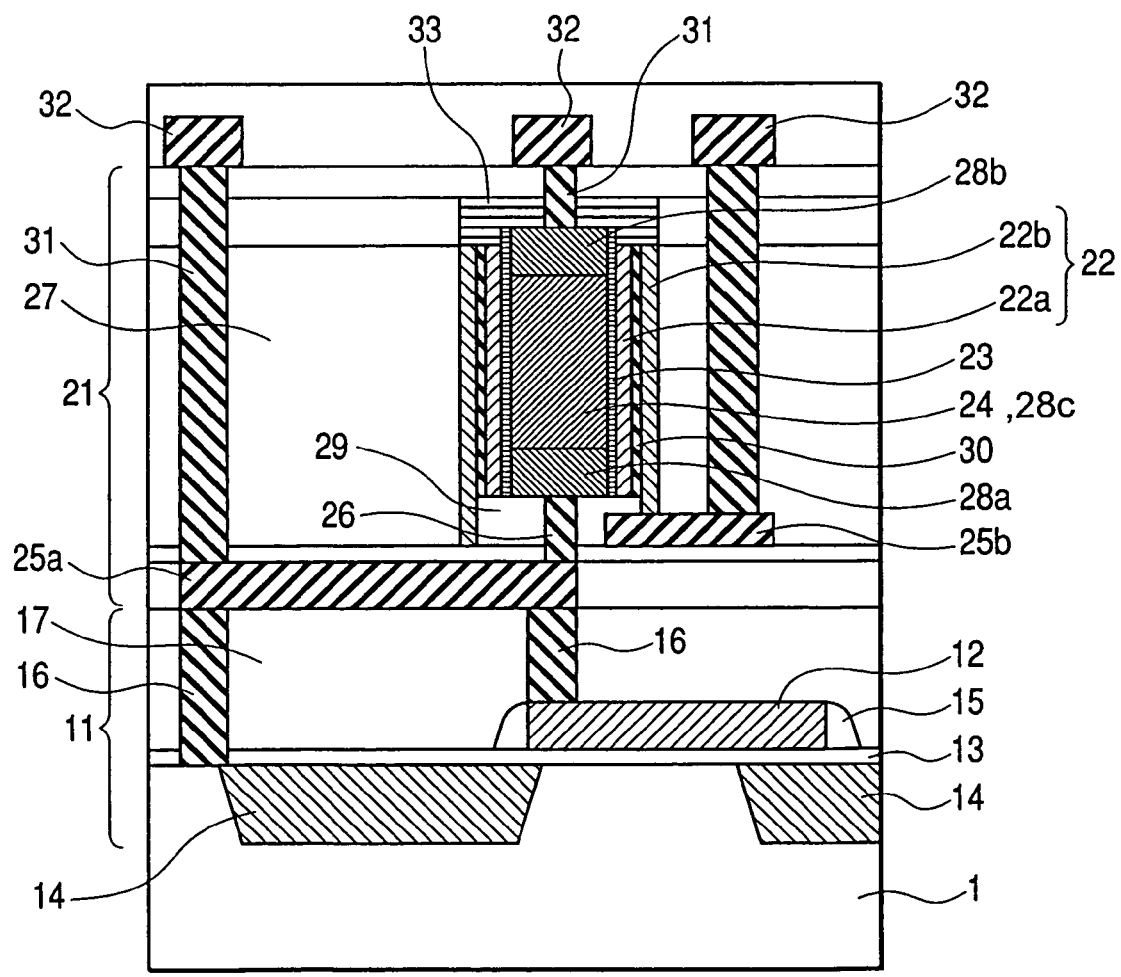
FIG. 1 is a schematic view showing a cross-sectional structure of a semiconductor device according to a first embodiment of the present invention.

First, a cross-sectional structure of a semiconductor device in a first embodiment is shown in FIG. 1. The structure is composed of a lateral transistor 11 disposed on a silicon substrate 1, and a vertical transistor 21 disposed on the lateral transistor 11. The lateral transistor 11 includes at least, as its constituting elements, a gate electrode 12, a gate oxide film 13, element isolation films 14, sidewalls 15, contacts 16, and a lower layer insulation film 17. The lateral transistor 11 can be of a type similar to a general MOS transistor mass-produced in great numbers at present. In addition, for components of a lateral transistor, there are already proposed a great number of materials, processes, and structures, and any thereof can be employed for the constituting elements of the lateral transistor 11. The vertical transistor 21 includes at least a gate electrode 22, a gate oxide film 23, a silicon tower 24, wiring 25a, 25b, contact 26, an upper layer insulation film 27, and a pedestal 29.

First, features of the gate electrode 22 according to the present invention are described. It is desirable that the material employed for the gate electrode 22 should be a silicon film containing impurities for improved conductivity. It is also desirable that this material should have other advantages such as high stability, and a minimum amount of oxidation, even during high-temperature processes, and excellent coverage of sides of the silicon tower 24. The gate electrode 22 is formed so as to surround the gate oxide film 23 and the silicon tower 24. Researches by the present inventions have indicated that this structure makes the electrical characteristics of the vertical transistor, compared with those of an ordinary lateral transistor, very susceptible to any effects of the stress of the gate electrode 22.

The present inventors have therefore devised a method of forming the gate electrode 22 into a split multi-layered film state and thus for reducing film stresses and preventing the vertical transistor 21 from deteriorating in characteristics and the characteristics from becoming nonuniform. More specifically, when the gate electrode 22 is formed, the film stresses thereof can be reduced by forming the film into a split form, and thus, the stresses applied to the gate oxide film 23 and to an internal channel section of the silicon tower 24 can be controlled to small values. Although the total film thickness is the same, the film stresses can be reduced by such plural-layering of the film. This is probably due to the fact that reducing the film thickness during one film-forming process reduces an internal crystalline grain size and hence, the stresses. The fact that when an oxide film slightly exists at the interface between the plural-layered films and the crystals of each film are definitely split, a stress reduction effect can be obtained, is already made clear by the present inventors' researches. Therefore, even when the silicon film of the gate electrode 22 is formed under the film-forming conditions where the film becomes amorphous, it is desirable that layering be provided while a crystallizing process is performed for each layer. However, even when each layer is formed under its amorphous state, an effect is observed by forming an oxide film at the interface.

In addition, when the film of the gate electrode 22 is formed into a split multi-layered film, other processes may also be performed during the formation of each film layer. For example, a process such as thermal treatment or etching may be introduced between the formation of a first layer and that of a second layer. In such a case, since an oxide film is slightly formed on the film surface of the first layer, a reliable reduction in stress can be anticipated. As described above, since the formation of a plural-layered film in the gate electrode 22 reduces the stresses applied to the internal channel section of the silicon tower 24 and to the gate oxide film 23 on the surface of the silicon tower 24, it is possible to reduce the gate oxide film 23 in leakage current and prevent drain current characteristics from deteriorating. It is also made clear that when the film stresses of the gate electrode 22 are excessive, if the thickness of the silicon tower 24 becomes nonuniform, the stress on the internal channel section of the silicon tower 24 also varies significantly and this leads to the nonuniformity of electrical characteristics. According to the present embodiment, however, the film stresses of the gate electrode 22 can be reduced and even if the thickness of the silicon tower 24 becomes nonuniform, changes in electrical characteristics (i.e., the nonuniformity thereof) can be minimized.

The gate electrode 22 can use, as its material, tungsten silicide, tungsten, tungsten nitride, molybdenum, molybdenum silicide, molybdenum nitride, or titanium nitride. Tungsten and molybdenum both have the advantage that resistance of the electrode can be reduced. In addition, tungsten silicide, tungsten nitride, molybdenum silicide, molybdenum nitride, and titanium nitride each have the advantages of excellent resistance to oxidation as well as of reduction in resistance of the electrode.

The silicon tower 24 has a part thereof constructed of impurity diffusion regions 28a and 28b and another part sandwiched between them which forms a channel region 28c, wherein a source-to-drain region of vertical transistor 21 is thus formed. It is desirable that boron be contained as an impurity of the impurity diffusion regions 28a and 28b to make the vertical transistor into a p-channel field-effect transistor, and that phosphor be contained to make the vertical transistor into an n-channel field-effect transistor. In addition, using a high-fusion-point metal (for example, tungsten or molybdenum) for the wiring 25a and the contact 26 is desirable in terms of thermal resistance and reduction in electrical resistance.

A method of manufacturing the semiconductor device used in the present embodiment is described below. For the lateral transistor 11, a technique similar to an ordinary MOSFET manufacturing method is used to manufacture the gate electrode 12, the gate oxide film 13, the element isolation films 14, the and sidewalls 15, and above these elements, form the contacts 16, lower layer insulation films 17a and 18b, wiring 25a, and wiring 25b. The wiring 25a and wiring 25b are electrically isolated from each other by forming a silicon oxide film or a silicon nitride film between the two sets of wiring. Next, in order to form the vertical transistor 21, after a silicon oxide film or a silicon nitride film has been formed on the vertical transistor 21, the contact 26 is formed at the position where it comes into contact with the bottom of the silicon tower 24, and then electrically connected to the wiring 25a. A silicon film is further deposited on the electrical connection and etching is performed in a region exclusive the section functioning as the silicon tower 24. At this time, the silicon tower 24 is formed by being doped with impurities to have a tri-layered structure with a high-density impurity-doped layer, a low-density impurity-doped layer, and a high-density impurity-doped layer constructed in that order. Consequently, the silicon tower 24 has a part thereof constructed of the impurity diffusion regions 28a and 28b in order to form the source-to-drain region of the vertical transistor 21. A thermal oxidation process is further performed to form the gate oxide film 23 on the surface of the silicon tower 24.

The gate oxide film 23 and the gate electrode 22 are to be sequentially formed after the thermal oxidation process, but depending on this process, the film stress of the gate electrode 22 significantly changes, which greatly affects the performance of the vertical transistor. Therefore, a gate electrode lower portion 22a is first obtained by depositing a silicon film above the gate electrode film 23 and providing an etching process. Furthermore, etching is conducted with the silicon tower 24 itself as a mask, thus forming the pedestal 29. Besides, a silicon film is deposited on a side of the pedestal 29 and on the surface of the gate electrode lower portion 22a, thus providing a gate electrode upper portion 22b. From the viewpoint of processing accuracy, it is desirable that both the gate electrode lower portion 22a and the gate electrode upper portion 22b be formed with an amorphous or microcrystal film and crystallized by later annealing. However, care is required since great stresses due to film shrinkage occur during the crystallization. When consideration is not to be given to stress reduction, no crystallization is usually conducted since there is no temperature rise from the formation of the gate electrode lower portion 22a to the formation of the gate electrode upper portion 22b. Instead, both the gate electrode lower portion 22a and the gate electrode upper portion 22b are crystallized during subsequent high-temperature annealing. During the crystallization, very large crystal grains spanning both the gate electrode lower portion 22a and the gate electrode upper portion 22b further grow to cause greater stresses. In that case, the interface between the gate electrode lower portion 22a and the gate electrode upper portion 22b becomes indistinct, resulting in an integrated film with large and small crystal grains mixed.

In order to prevent the film stresses from increasing, in the present embodiment, the formation of the gate electrode lower portion 22a is followed by annealing-based crystallization, which is then followed by the formation of the gate electrode upper portion 22b. By these processes, as shown in, for example, FIG. 1, a thin silicon oxide film layer 30 is formed at the interface between the gate electrode lower portion 22a and the gate electrode upper portion 22b. In addition, inside the respective films of the gate electrode lower portion 22a and the gate electrode upper portion 22b, crystal grains exist independently. Since these crystal grains do not become a succession of those, the gate electrode 22 can be reduced in film stress. The thickness of the silicon oxide film layer 30 is required for epitaxial growth to be impeded during the crystallization of the gate electrode upper portion 22b; therefore, it needs only to be greater than several atomic layers of thickness. When the respective films of the gate electrode lower portion 22a and the gate electrode upper portion 22b are formed, each film may be formed during a plurality of split layering processes. In addition, a greater number of layering processes yield a higher reduction effect against stresses. At this time, taking measures so that the surface of each film constituting the plural-layered film section is slightly oxidized makes crystal grains grow independently inside each film, thus providing a stress reduction effect.

In addition, even if annealing for crystallization is not conducted between the film-forming process for the gate electrode lower portion 22a and that of the gate electrode upper portion 22b, stresses can be reduced by conducting the film-forming process for the gate electrode lower portion 22a and providing the silicon oxide film layer 30 at the interface with respect to the gate electrode upper portion 22b. That is to say, since the presence of the silicon oxide film layer 30 makes the crystals in both the gate electrode lower portion 22a and the gate electrode upper portion 22b progress in growth easily and independently, the crystals tend to decrease in grain size and consequently, the film stresses are reduced. The stress reduction effect obtained using this method is small in comparison with the effect obtained using the method in which annealing for crystallization is conducted between the film-forming process for the gate electrode lower portion 22a and that of the gate electrode upper portion 22b. However, there is the advantage that since the number of process steps can be reduced, products can be manufactured at low costs.

After the film-forming process for the gate electrode upper portion 22b, an upper layer insulation film 27 is deposited and then a contact 31 and upper wiring 32 are sequentially formed.

As described above, the semiconductor device of a configuration of the present embodiment is characterized by comprising: a tower-like gate pillar (e.g., the silicon tower 24) formed on a semiconductor substrate (e.g., the silicon substrate 1) via an insulation layer (such as an interlayer insulation film) and having a channel region formed so as to be positioned between the impurity diffusion regions 28a and 28b in a layering direction; a gate insulation film formed on an outer surface of the gate pillar (the gate insulation film may be, for example, an oxide film or a film having a dielectric constant higher than that of a silicon oxide film); and the gate electrode film 22 formed on an outer surface of the gate insulation film; wherein the gate electrode film 22 is formed of plural layers each formed in order from the gate pillar, in the direction where the gate electrode film is formed.

The semiconductor device of another configuration is characterized by comprising: a gate pillar formed on the semiconductor substrate via an insulation layer and having the channel region 28c formed so as to be positioned between the impurity diffusion regions 28a and 28b in a layering direction; the gate electrode film 22 formed so as to enclose an outer circumferential side of the gate pillar; and the gate insulation film 23 formed between the gate pillar and the gate electrode film; wherein the gate electrode film 22 includes a first electrode film (e.g., a gate electrode upper portion 22a) formed as to enclose the gate pillar from a circumferential direction, and a second electrode film (e.g., the gate electrode lower portion 22b) formed so as to enclose the first electrode film from a peripheral side.

Thus, either of the above configurations makes it possible to produce a fine crystalline grain structure effectively in a radial direction of the gate pillar and hence to effectively reduce the stresses applied. In addition, deterioration of electrical characteristics can be effectively suppressed by effectively reducing the stress applied to the film facing the gate insulation film.

It is preferable that the more specific structure of the gate electrode be as follows:

The first electrode film, for example, is formed more thinly than the second electrode film.

Thus, the stress of the first electrode film, applied to the gate pillar, can be reduced. In addition, when the outside of the electrode film communicates with the wiring layer mentioned above, a structure suitable for high-speed processing can be obtained by reducing contact resistance.

Referring to the relationship in crystalline grain size between the gate electrode films, the first electrode film is characterized in that it is formed with a crystalline grain size smaller than that of the second electrode film. Any effects of a stress on the gate insulation film can be effectively reduced.

For example, in this case, both the first and second electrode films can be a polycrystalline silicon film.

In addition, the first and second electrode films can each comprise a polycrystalline silicon film.

For example, in this case, the first electrode film is characterized in that it is a polycrystalline silicon film, and the second electrode film is characterized in that it is a conductive film containing a metal element. For example, the conductive film can be a film having either W (tungsten), Mo (molybdenum), Ti (titanium), TiN (titanium nitride), WN (tungsten nitride), or Ru (ruthenium). Hence, a semiconductor device suitable for high-speed processing can be formed.

The aforementioned conductive film can otherwise be a film having WSi (tungsten silicide), NiSi (nickel silicide), TiSi (titanium silicide), or RuSi (ruthenium silicide). It is thus possible to reduce resistance effectively and to form a device adapted for high-speed processing. In addition, since oxidation becomes suppressible, a low-resistance state can be maintained effectively.

A silicon oxide, for instance, is formed, as an example of a plural-layered gate, between the first electrode film and the second electrode film.

In another example of a plural-layered gate, a gate electrode is formed of polysilicon and then As (arsenic), P (phosphorus), B (boron), Ge (germanium), or Ar (argon) ions are implanted in the polysilicon.

Referring to a lower end of the plural-layered gate, a wiring layer 25b is formed on the aforementioned substrate side of the gate electrode films. The plural-layered gate in this case is characterized in that the gate electrode upper portion 22a, an example of the first electrode film, has a film end positioned far from the wiring layer 25b. The plural-layered gate is also characterized in that the gate electrode lower portion 22b, an example of the second electrode film, is formed so as to electrically connect with the wiring layer 25b. Thus, it is possible to ensure appropriate electrical contact while at the same time suppressing the stresses on the gate electrode films.

In the present embodiment, the first gate electrode film is a film disposed in an opposed condition with respect to the gate insulation film mentioned above.

The channel 28c is characterized in that it is formed with a grain size greater than that of the gate electrode upper portion 22a, which is an example of the first electrode film, or of the gate electrode lower portion 22b, which is an example of the second electrode film. Hence, it is possible to construct a high-performance semiconductor device by, while simultaneously increasing electron mobility of the channel, reducing the stresses applied from the electrode films. This relationship, for example, can be measured as follows: Provided that the above-mentioned channel region includes silicon and that the above-mentioned first electrode also includes silicon. That is, in the cross-sectional view of the layering direction, a line is drawn axially (layering direction) in the channel region, then crossing points with respect to grain boundaries on the line are marked, and an average length of the crossing points is calculated. Similarly, it is also possible to calculate an average and compare for the gate electrode films.

It is preferable that the related manufacturing method should include a step of forming an amorphous first silicon layer as a first gate electrode layer so as to enclose the silicon tower 24 (gate pillar) from a circumferential direction, a step of thermally treating the above-formed silicon layer, a step of forming a polycrystalline second silicon layer as a second gate electrode layer so as to enclose the above-mentioned first gate electrode layer from a peripheral side, and a step of thermally treating the above-mentioned second gate electrode layer. The amorphous silicon can contain fine-grained silicon.

It is possible to include a step of forming the gate electrode by use of polysilicon and then implanting either As, P, B, Ge, or Ar ions in the polysilicon.

Figure 2:
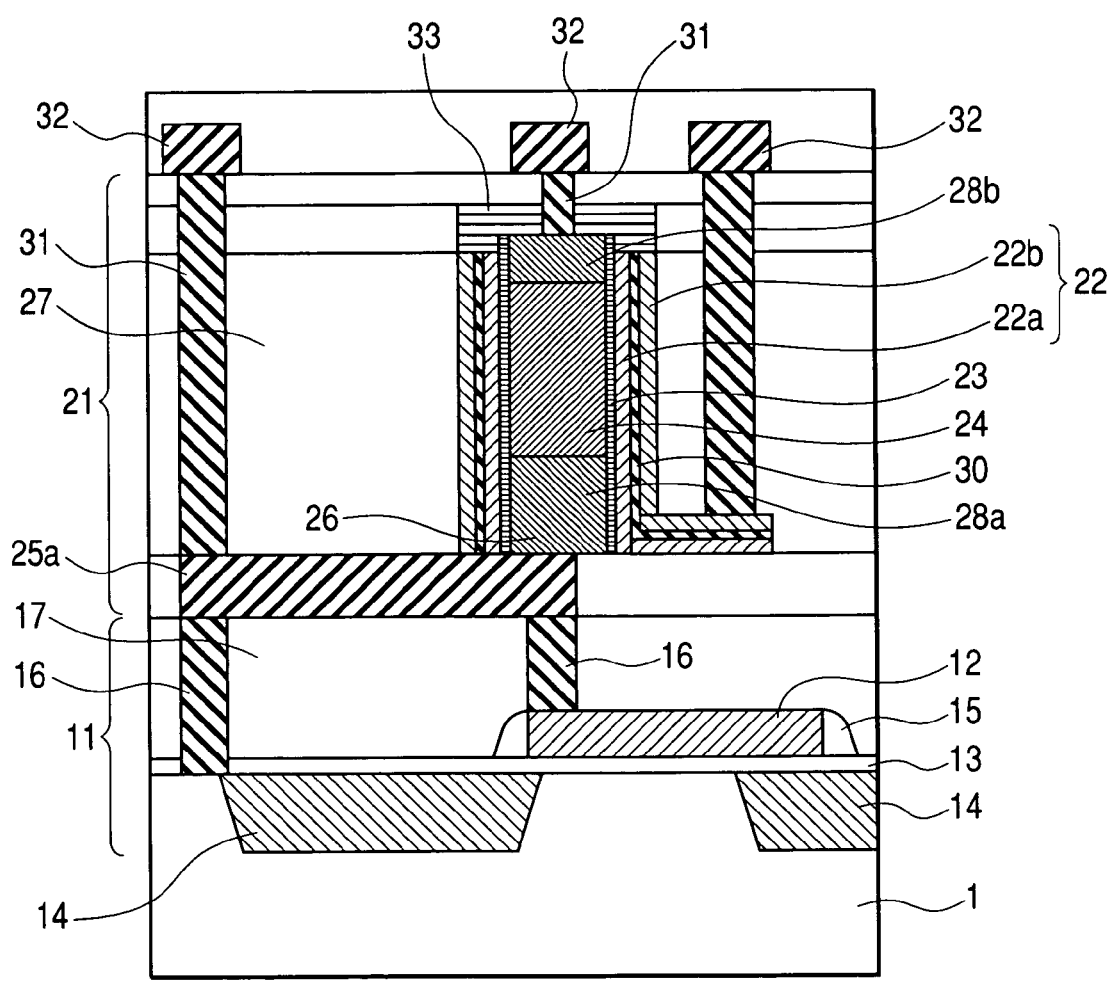
FIG. 2 is a schematic view showing a cross-sectional structure of a semiconductor device according to a second embodiment of the present invention.
Figure 3:
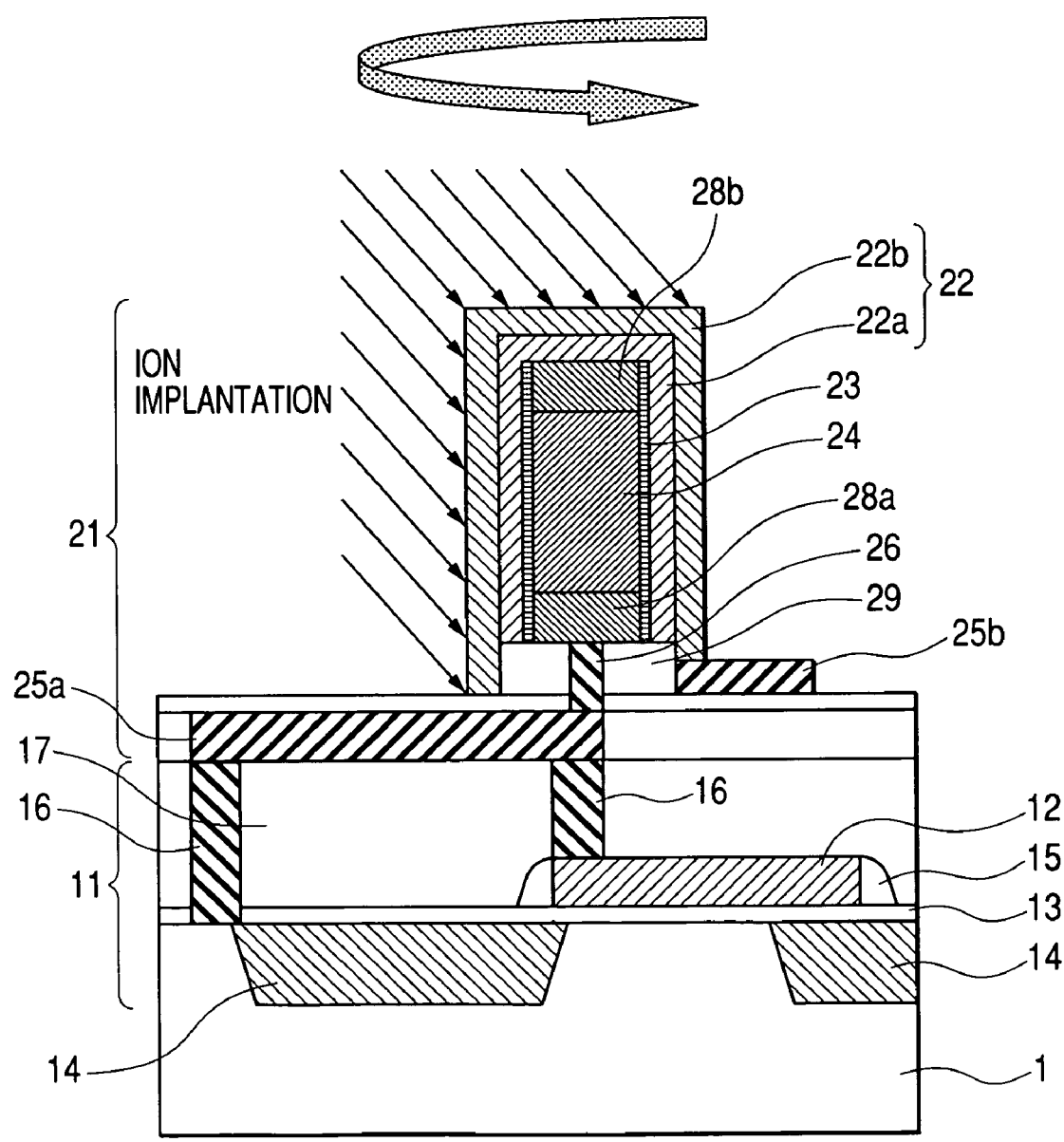
FIG. 3 is another schematic view showing the cross-sectional structure of the semiconductor device in the embodiment shown in FIG. 2.
Figure 4:
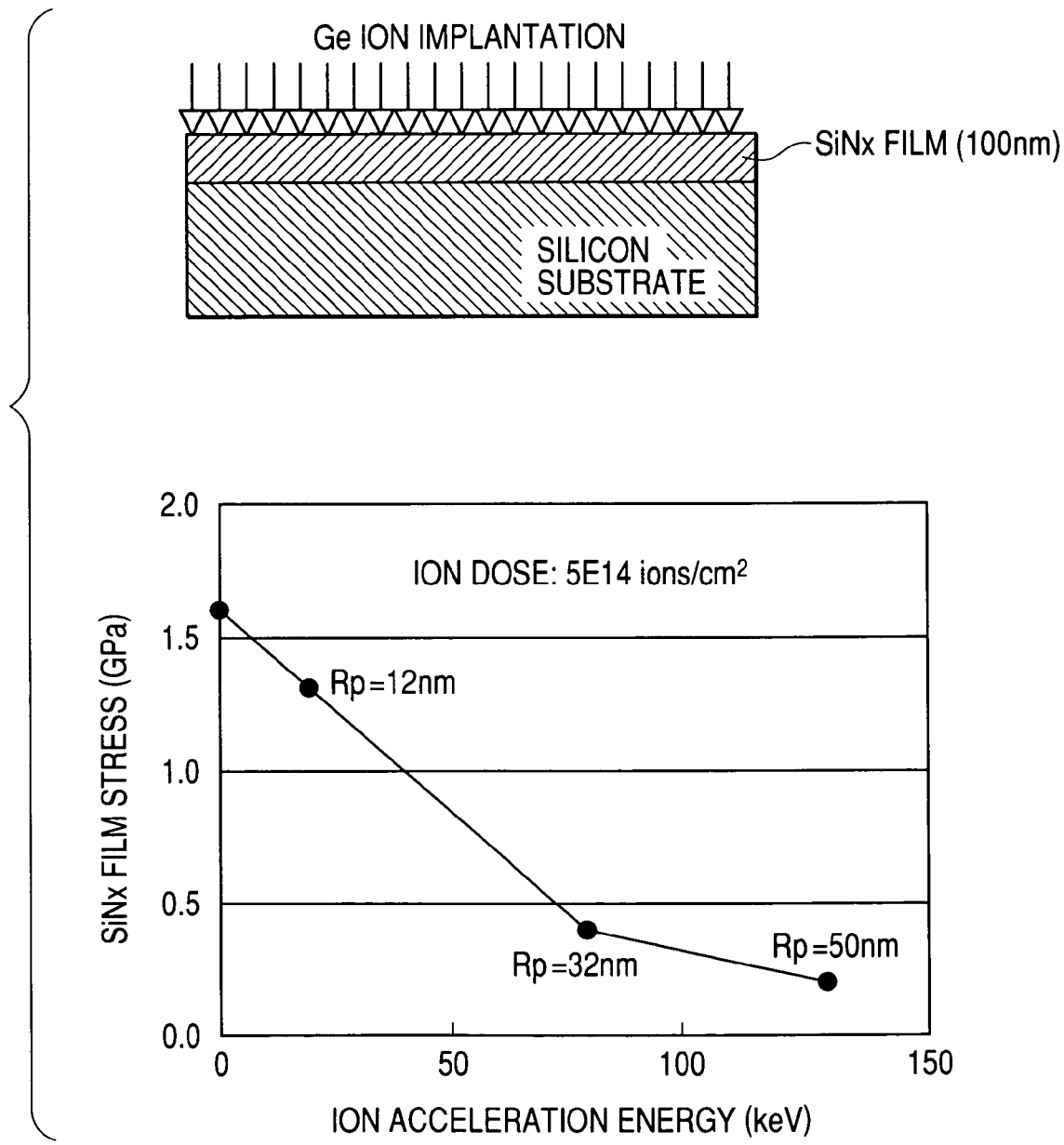
FIG. 4 is a schematic diagram for explaining ion implantation in the second embodiment.

Next, a second embodiment of the present invention is described below using FIGS. 2 and 3. It is basically possible to take either of the configurations used in the description of the embodiment of FIG. 1. The present (second) embodiment reduces stresses by performing an oblique ion-implanting process on a gate electrode 22. A gate electrode lower portion 22a is formed, and further a gate electrode lower portion 22a is formed without the gate electrode lower portion 22a being crystallized. Annealing for crystallization is subsequently provided to provide a high-stress state. After this, as shown in FIG. 3, during wafer rotation, ions are implanted diagonally from an upward direction of the wafer. Stress reduction effects by ion implantation are shown in FIG. 4. This figure applies to Ge ion implantation in a silicon nitride film having a thickness of 100 nm, and indicates that significant reduction in stress can be realized by implanting ions to a depth equal to or greater than ½ of the film thickness. A similar effect can also be obtained by implanting ions in the polysilicon constituting the gate electrode. Since implanting ions too deeply damages the gate oxide film and thus causes a leakage current or the like, it is important to implant ions to a depth within the range in which the ions implanted will not reach the gate oxide film. The film stresses on the gate electrode 22 are reduced below ⅕ of their original values by the ion implantation. Subsequent annealing slightly increases the stresses, but a low-stress state is maintained. Such a stress reduction effect is probably due to the fact that bonds between silicon atoms are broken by the ion implantation. In terms of the species of ion implanted, a heavier element is more effective, and more particularly, arsenic, phosphorus, boron, silicon, germanium, argon, and antimony are valid in that each does not easily affect device characteristics. It is desirable that a dose be set so that a maximum density of the atoms implanted in the silicon crystal stays within a range from $1 \times 10^{19}$ pc/cm$^3$ to $1 \times 10^{21}$ pc/cm$^3$. It is also necessary to set an acceleration voltage so that the ions implanted will not reach the gate oxide film 23. Stress reduction by such ion implantation is even more effective when used in combination with the first embodiment of the present invention. More specifically, it is possible to form the gate electrode lower portion 22a, then crystallize the film by annealing, and implant ions. Likewise, it is possible to further form the gate electrode upper portion 22b, anneal the film, and implant ions.

The above processes reduce the force applied from the gate electrode 22 to the silicon tower 24 and the gate oxide film 23. It is therefore possible to achieve reduction in any internal leakage currents of the gate oxide film 23 and the prevention of deterioration in drain current characteristics. In addition, even if the thickness of the silicon tower 24 becomes nonuniform, changes in (i.e., the nonuniformity of) electrical characteristics can be minimized. Furthermore, in the present embodiment, the number of annealing operations can be reduced and since a short-TAT ion implantation process is employed for stress reduction, chips can be manufactured at low costs.

Figure 5:
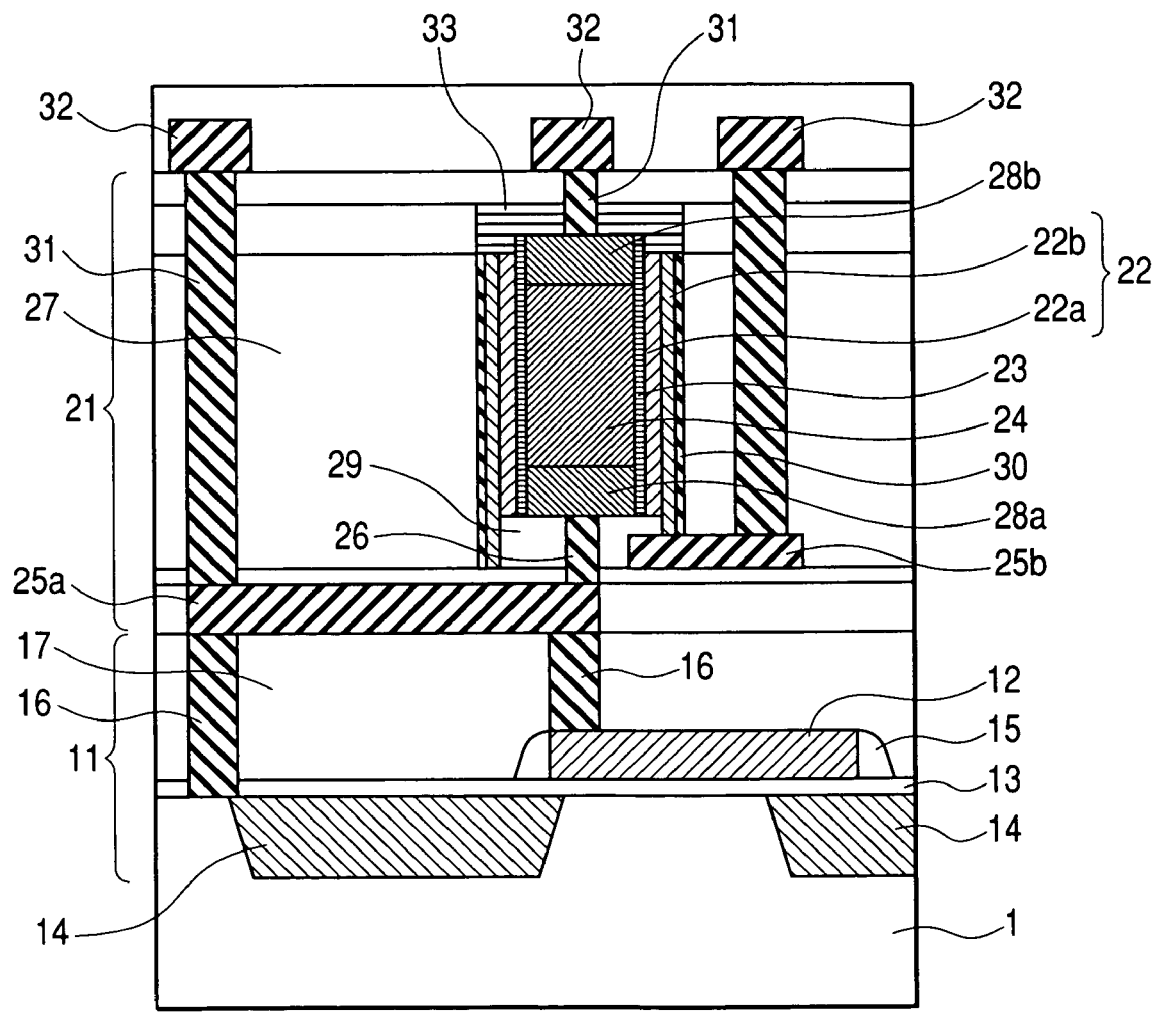
FIG. 5 is a schematic view showing a cross-sectional structure of a semiconductor device according to a third embodiment of the present invention.
Figure 6:
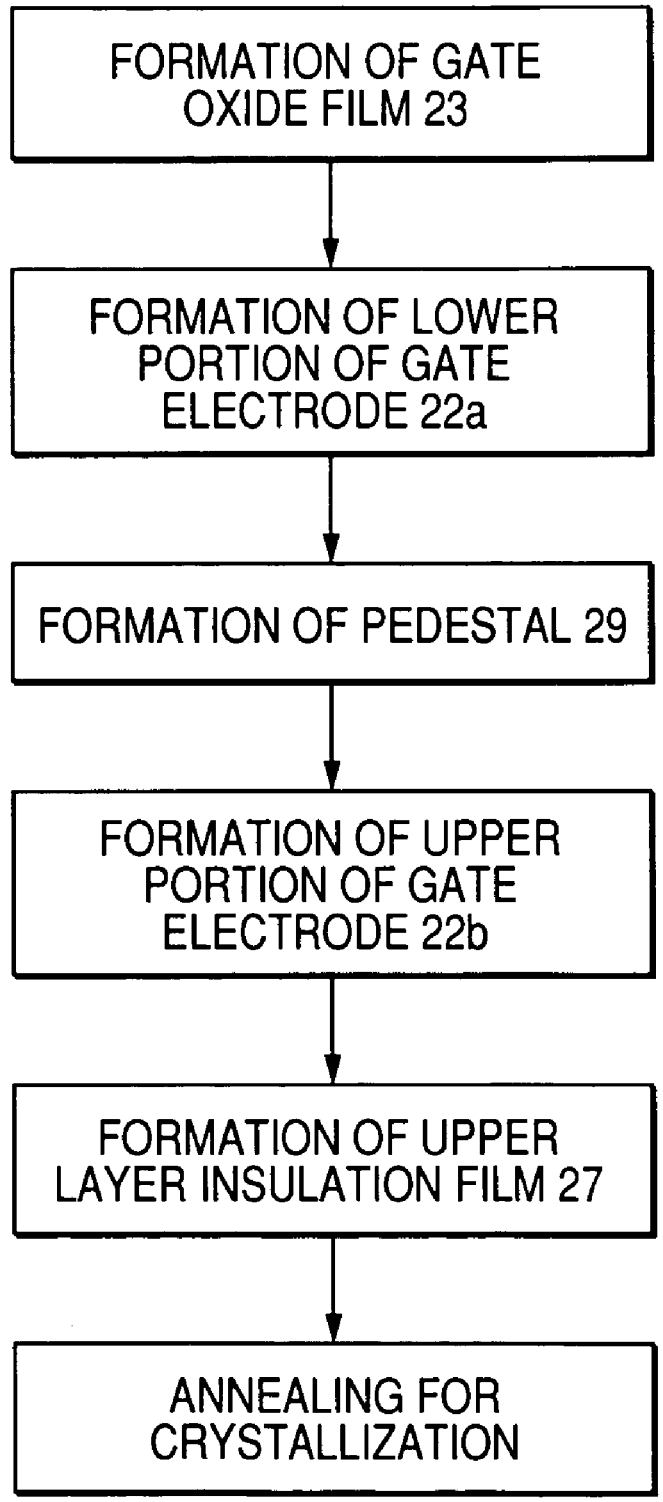
FIG. 6 is a flowchart showing the flow of manufacture of the semiconductor device in the third embodiment shown in FIG. 5.
Figure 7:
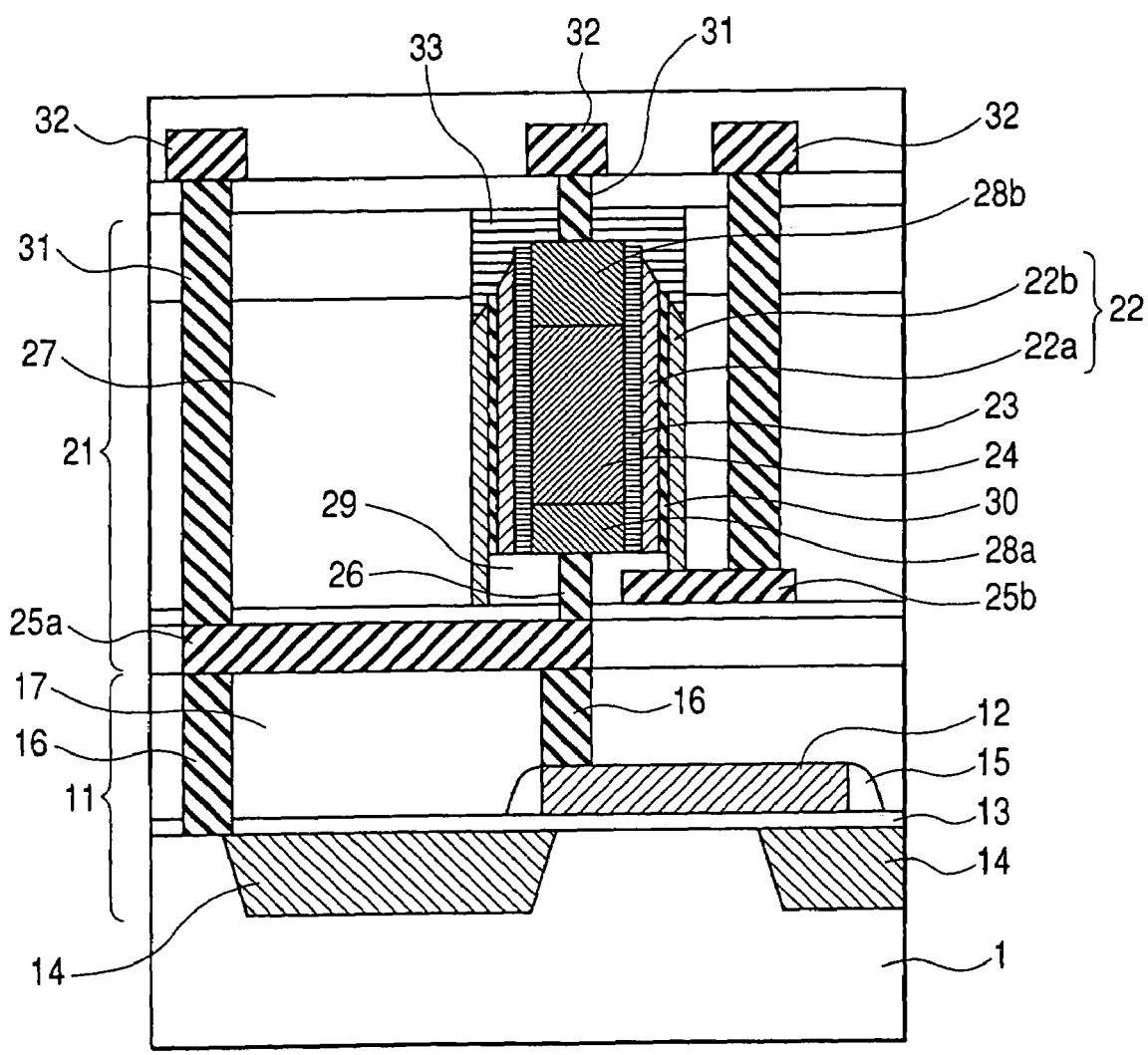
FIG. 7 is a schematic view showing a cross-sectional structure of a semiconductor device according to another embodiment of the present invention.

Next, a third embodiment of the present invention is shown below using FIG. 5. It is basically possible to take the embodiment shown in FIG. 1. The present embodiment features a manufacturing method. Steps from manufacturing a lateral transistor 11 and a silicon tower 24 to forming a gate oxide film 23 on the surface of the silicon tower 24 are the same as the process steps in the first embodiment. As shown in the flowchart of FIG. 6, in the present embodiment, forming the above film is followed by depositing a gate oxide film 23, depositing a gate electrode lower portion 22a, forming a pedestal 29, and depositing a gate electrode upper portion 22b, in that order. The present embodiment, however, is characterized in that instead of an annealing-for-crystallization process not being inserted between the formation of the gate electrode lower portion 22a and the formation of the gate electrode upper portion 22b, the formation of the gate electrode upper portion 22b is followed first by formation of an upper layer insulation film 27 and then by annealing for crystallization. Thus, when the gate electrode 22 shrinks during the annealing process for crystallization, since the upper layer insulation film 27 and the gate electrode 22 are bonded together, the upper layer insulation film 27 bears shrinkage force, hence reducing the force applied from the gate electrode 22 to the silicon tower 24 and the gate oxide film 23. Combination of this method with the first/second embodiment of the present invention makes the method even more effective in that stresses are further reduced.

During transmission-type electron microscopy of a cross section of a device to which the present invention is applied, a polycrystal that contains very large crystal grains spanning both the gate electrode lower portion 22a and gate electrode upper portion 22b is observed at the gate electrode 22. Also, a silicon oxide film 30 produced by oxidation of the gate electrode 22 is observed on the surface thereof, independently of the upper layer insulation film 27. The silicon oxide film 30 is produced by surface oxidation of the gate electrode 22 due to diffusion of the oxygen contained in the upper layer insulation film 27.

Reduction in any internal leakage currents of the gate oxide film 23 and the prevention of deterioration in drain current characteristics can be achieved by the above embodiment. Also, even if the thickness of the silicon tower 24 becomes nonuniform, changes in (i.e., the nonuniformity of) electrical characteristics can be minimized. In addition, since process steps can be reduced to the smallest number, the present embodiment, although slightly inferior to the first and second embodiments in terms of effectiveness, is advantageous in that chips can be manufactured at the lowest cost.

In the present embodiment, combination of a lateral transistor and a vertical transistor has heretofore been described with an SRAM structure taken into consideration. Another embodiment of the present invention is outlined in FIG. 7. It is basically possible to take either of the configurations shown in the embodiment of FIG. 1. Referring to an upper end of the plural-layered gate, the present embodiment is characterized in that an end of a first electrode film is formed farther from the above-mentioned semiconductor substrate than an end of a second electrode film. It is preferable that as shown, the first electrode film be disposed in an opposed condition with respect to a gate insulation film. This means that an upper portion of the gate insulation film includes a region formed more thinly than a region formed below the upper portion of the gate insulation film, and thus that the stress of an upper end that is applied to the gate insulation film can be reduced. For example, an upper end of the second electrode film is formed so as to lie closer to the above-mentioned upper impurity region than to the interface between the impurity region and the channel region. Also, upper ends of the first and second electrode films are each formed with a thickness difference equal to or greater than a thickness of the gate electrode film. In addition, the present embodiment is likewise valid, even when a silicon tower is produced by etching a silicon substrate or making epitaxial growth of silicon on the silicon substrate.

It is possible to provide a semiconductor device capable of preventing a product yield from being decreasing and performance from deteriorating, or capable of achieving high-density integration of chips and high performance.

Legend on the numerals used in the drawings accompanying the present specification is shown below.

1 . . . Silicon substrate, 11 . . . Lateral transistor, 12 . . . Gate electrode, 13 . . . Gate oxide film, 14 . . . Element isolation film, 15 . . . Sidewall, 16 . . . Contact, 17a, 17b . . . Lower layer insulation film, 21 . . . Vertical transistor, 22 . . . Gate electrode, 22a . . . Gate electrode upper portion, 22b . . . Gate electrode lower portion, 24 . . . Silicon tower, 25, 25a, 25b . . . Wiring, 26 . . . Contact, 27 . . . Upper layer insulation film, 28a, 28b . . . Impurity diffusion regions, 29 . . . Pedestal, 30 . . . Silicon oxide film layer, 31 . . . Contact, 32 . . . Upper wiring, 33 . . . Insulation layer.

What is claimed is:

1. A semiconductor device comprising:
    a semiconductor substrate;
    a tower-like gate pillar formed on said semiconductor substrate via an insulation layer, said gate pillar including a channel region formed so as to be positioned between impurity diffusion regions in a vertically extending direction with respect to a principal side of said semiconductor substrate;
    a gate insulation film formed on an outer surface of said gate pillar; and
    a gate electrode film formed on an outer surface of said gate insulation film;
    wherein a wiring layer is formed below said gate electrode film on the principal side of said substrate;
    wherein said gate electrode film is formed of a plurality of stacked layers including a first electrode film and a second electrode film formed on an outer circumferential side of said first electrode film; and
    wherein said first electrode film has an end thereof spaced from said wiring layer, and said second electrode film is formed so as to electrically connect with said wiring layer.

2. A semiconductor device comprising:
    a semiconductor substrate;
    a tower-like gate pillar formed on said semiconductor substrate via an insulation layer, wherein said gate pillar includes a channel region formed so as to be positioned between impurity diffusion regions in a vertically extending direction with respect to a principal side of the substrate;

a gate insulation film formed between said gate pillar and a gate electrode film; and said gate electrode film is formed on said gate insulation film so as to enclose an outer circumferential side of said gate pillar, wherein said gate electrode film includes a first electrode film formed as to enclose said gate pillar from a circumferential direction thereof, and a second electrode film formed so as to enclose said first electrode film from a peripheral side thereof, and wherein said first electrode film is formed with grain size smaller than that of said second electrode film.

3. A semiconductor device comprising:

a semiconductor substrate;

a tower-like gate pillar formed on said semiconductor substrate via an insulation layer, wherein said gate pillar includes a channel region formed so as to be positioned between impurity diffusion regions in a vertically extending direction with respect to a principal side of the substrate;

a gate insulation film formed between said gate pillar and a gate electrode film; and said gate electrode film is formed on said gate insulation film so as to enclose an outer circumferential side of said gate pillar, wherein said gate electrode film includes a first electrode film formed as to enclose said gate pillar from a circumferential direction thereof, and a second electrode film formed so as to enclose said first electrode film from a peripheral side thereof, and wherein said channel region is formed with a grain size greater than that of said first electrode film or said second electrode film.

* * * * *